United States Patent [19]

Greve et al.

[11] 4,247,383

[45] Jan. 27, 1981

[54] CATHODIC SYSTEM WITH TARGET, FOR VACUUM SPUTTERING APPARATUS FOR THE APPLICATION OF DIELECTRIC OR NONMAGNETIC COATINGS TO SUBSTRATES

[75] Inventors: Walter Greve, Bruchköbel; Edgar Kaiser, Seligenstadt; Dieter Gröne, Bruchköbel; Ulrich Patz, Hörstein, all of Fed. Rep. of Germany

[73] Assignee: Leybold Heraeus GmbH, Cologne, Fed. Rep. of Germany

[21] Appl. No.: 930,436

[22] Filed: Aug. 2, 1978

[30] Foreign Application Priority Data

Aug. 6, 1977 [DE] Fed. Rep. of Germany ....... 2735525

[51] Int. Cl.³ .............................................. C23C 15/00
[52] U.S. Cl. ................................................... 204/298
[58] Field of Search ........................... 204/298, 192 R

[56] References Cited

U.S. PATENT DOCUMENTS

| | | | |
|---|---|---|---|
| 3,540,993 | 11/1970 | Wurm | 204/298 |
| 3,878,085 | 4/1975 | Corbani | 204/298 |
| 3,887,451 | 6/1975 | Cuomo | 204/298 |
| 4,022,947 | 5/1977 | Grubb | 204/298 |
| 4,116,791 | 9/1978 | Zega | 204/298 |
| 4,116,806 | 9/1978 | Love | 204/298 |
| 4,162,954 | 7/1979 | Morrison, Jr. | 204/298 |

OTHER PUBLICATIONS

Current Industrial Applications of High Rate Sputtering, Hugh R. Smith, Jr., Metal Finishing, Mar. 1978, pp. 60-63.
Sputtering Cathode for Magnetic Film Deposition, B. I. Bertelsen, IBM Technical Disclosure Bulletin, vol. 6, No. 2, Jul., 1963.

Primary Examiner—Howard S. Williams
Assistant Examiner—William Leader
Attorney, Agent, or Firm—Sprung, Felfe, Horn, Lynch & Kramer

[57] ABSTRACT

A cathodic system has a planar target for use in an atomizing apparatus for the sputtering of a dielectric or nonmagnetic coating onto a substrate. The cathodic system includes a magnetic field generator disposed on the side of the target opposite from that of the substrate and is constructed in the form of a planar coil which is disposed parallel to the target and has an area which corresponds substantially to the area of the target. The planar coil is insulated from the target and is cooled during use.

14 Claims, 12 Drawing Figures

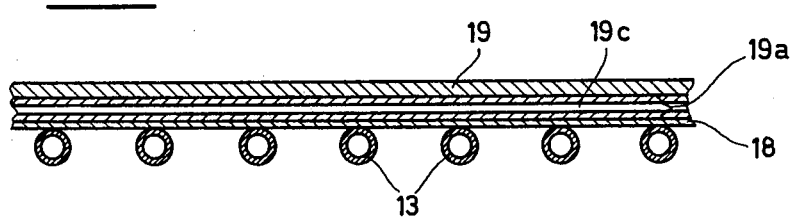
FIG. 2
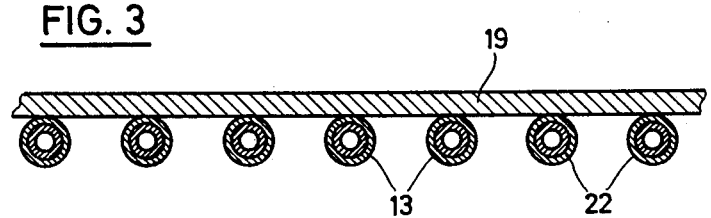
FIG. 3
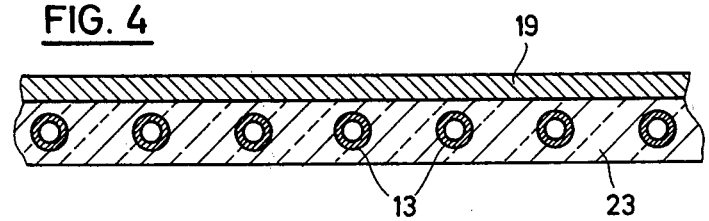
FIG. 4
         
FIG.5a    FIG.5b    FIG.5c    FIG.5d

CATHODIC SYSTEM WITH TARGET, FOR VACUUM SPUTTERING APPARATUS FOR THE APPLICATION OF DIELECTRIC OR NONMAGNETIC COATINGS TO SUBSTRATES

BACKGROUND

The invention relates to a cathodic system having a planar target for vacuum sputtering systems for the application of dielectric or nonmagnetic coatings to substrates, and having a magnetic field generator disposed behind the target as seen from the substrates, and insulated from the target.

In contrast to the vacuum depositing method, the rate of deposition, i.e., the amount of coating material deposited per unit of time, is relatively low in the cathodic sputtering process. Consequently a number of methods have become known for the purpose of increasing the rate of deposition of the coating material. This can be accomplished, for example, by raising the temperature level of the cathode or target, by increasing the pressure prevailing in the apparatus, by the production of magnetic fields, and/or by the production of high-frequency discharges within the sputtering depositing apparatus. A high rate of deposition is in many cases essential to economically feasible production.

Through German Pat. No. 737,613 it is known to increase the rate of deposition, when a cathode in the form of a planar coil is used, by raising the cathode to a higher temperature level by direct current flow. In this case, however a thermal stress is unavoidably applied to the substrates, which in many cases is undesirable. A magnetic field, which of itself would also tend to increase the rate of deposition, is said to be prevented by supplying the cathode with alternating current as the heating current and with a pulsating direct current of the same frequency with a certain phasing.

From German Offenlegungsschrift 15 15 296, it is known to increase the atomization rate by making a planar coil of the material to be deposited, for example, and supplying it with high-frequency current. Such a method, however, is limited to the production of coatings of an electrically conductive material. Furthermore, even so, the rate of deposition is not increased in a desirable manner.

Through German Offenlegungsschrift 16 90 691 in conjunction with German Pat. No. 15 15 313, it is furthermore known to dispose a plurality of rod-shaped individual cathodes parallel to one another in one plane and to bring them alternately to different alternating current potentials, while a direct or alternating current flows simultaneously through the individual rods producing a magnetic field which increases the ionization probability. Such an apparatus, however, necessitates a galvanic separation of the individual cathode rods, involving a large number of voltage and current lead-throughs as well as separate power supplies for feeding current to the cathode rods for the production of the magnetic field. If such an apparatus is to be used for the spray application of dielectric coatings, the only possibility is to cover the individual cathode rods with tubes of the dielectric material. The desirable uniformity of the deposited coatings cannot be achieved in this manner.

Through U.S. Pat. No. 3,878,085 it is furthermore known to dispose, on the side of the target material facing away from the substrates, an oval or circular pole shoe system which produces a magnetic field whose lines of force pass out through the target surface and, after describing arcuate paths, return into same. In this manner it is possible to obtain a desirably high atomizing and depositing rate. The uniformity of the coating density distribution is also satisfactory as long as the substrates are within an area which is markedly smaller than the target area. An important disadvantage in this case, however, is that the rate of atomization of the target material varies greatly according to the local field strength, so that during the atomization, deep grooves form in the target corresponding to the shape of the magnetic field. For this reason only about 30% of the expensive target material can be utilized.

Lastly, it is also known to equalize the atomization rates, which differ greatly from one area to the next when a magnetic field is used, by keeping the magnetic system in constant movement relative to the target material. Aside from the fact that this requires a complex mechanical system, the utilization of the target material cannot be greatly improved, i.e., it cannot be increased much beyond about 50 to 60%.

THE INVENTION

The object of the invention is to devise a cathodic system of the initially described kind, which permits a high atomization and deposition rate using magnetic fields without the development of deep grooves in the target material which cause the target to become prematurely unusable.

The above object is accomplished in accordance with the invention in that the magnetic field generator is in the form of a planar or pancake coil which is disposed parallel to the target and has an area that is substantially the same as the target area, and that the planar coil is provided with a cooling system.

A planar, continuous coil of this kind requires basically only two electrical terminals at its ends, through which it is supplied with a relatively high direct or alternating current for the production of the desired magnetic field. The required potential difference between the terminals of the planar coil generally amounts to only a few volts. The current, however, can amount to as much as 1000 amperes. Depending on the material of which the target is made, the target can have a direct current or a high-frequency alternating current applied to it, so that it is not necessary that the planar coil be connected to a relatively high direct-current voltage of as much as 1200 volts or to a high-frequency generator. It is possible by appropriately designing the planar coil to produce a planar magnetic field of virtually any desired form and size. The magnetic field density distribution can be varied by varying the distances between the individual conductors, the direction of the current and the shape of the planar coil. Due to the fact that the magnet coil has an area which corresponds substantially to the target area of the planar coil, and due to a precise control of the magnetic field density distribution, the distribution of the deposited coatings is improved not only without movement of the substrates but also without movement of the magnetic fields. The small number of terminals and of leads through the wall of the vacuum sputtering apparatus make possible a simple, trouble-free design.

The invention can be advantageously further developed with reference to the insulation and cooling of the planar coil and the advantages thereof will be further explained in the detailed description.

BRIEF DESCRIPTION OF THE DRAWINGS

Embodiments of the invention will be further explained below in conjunction with the appended drawings wherein:

FIG. 2 is a longitudinal cross-sectional view taken through the cathodic system of FIG. 1, FIG. 3 is a variant of the subject of FIG. 2, in which the insulator between the planar coil and target is in the form of an envelope of insulating material about the individual turns of the planar coil, FIG. 4 is another variant of the subject of FIG. 2, in which the planar coil is embedded in a continuous body of insulating material, FIGS. 5a to 5d are various cross-sections of the conductor in the planar coil.

DETAILED DESCRIPTION OF THE INVENTION

Figure 1:
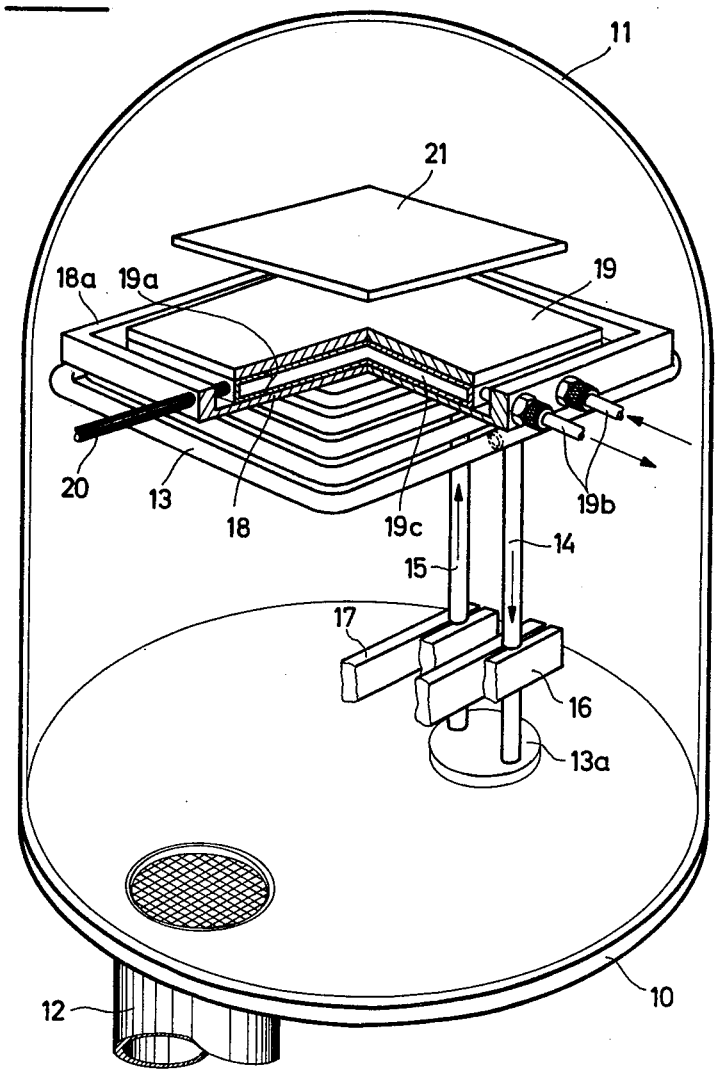
FIG. 1 is a perspective view of a cathodic system in accordance with the invention in a vacuum chamber which is represented diagramatically.

In FIG. 1 there can be seen a base plate 10 on which there is placed a bell-like vacuum chamber 11. The vacuum chamber can be evacuated to some $10^{-4}$ to $10^{-2}$ millibars. A continuous planar coil 13 consisting of a plurality of approximately rectangular turns disposed one inside the other is situated within the vacuum chamber. The planar coil has terminal ends 14 and 15 which are connected to the terminal clamps 16 and 17, which are connected to a power source which is not represented. The conductor forming the planar coil is a hollow conductor having the cross section represented in FIG. 5a, in which a coolant (water) is circulated during the operation of the system. The terminal ends 14 and 15 are fastened in a lead-through insulator 13a which is disposed in a vacuum-tight manner in the base plate 10.

The upper generatrices of the individual turns of the planar coil 13 are situated in a single upper plane and the lower generatrices in a single lower plane. A flat plate 18 of insulating material lies on the top side of the planar coil 13, and can consist of glass, a ceramic material or other insulating material, and it has a raised margin 18a. On the insulating plate 18 there is a cathode 19a which is in the form of a shallow planar box and is provided with coolant connections 19b. A coolant which removes the heat that develops when the apparatus is in operation is circulated through the cathode cavity 19c. The cathode 19a consists of a nonmagnetic, metallic material which does not interfere with the magnetic field of the planar coil 13. The voltage required for atomization is delivered to the cathode through a conductor 20. On the cathode lies a target 19 of a material that is the same as the material of the coating to be deposited by the cathodic sputtering process, and can consist of dielectric or nonmagnetic material. Above the target 19, and parallel thereto, there is disposed a substrate 12, which is represented only diagrammatically, and which is connected as the anode.

In the operation of the apparatus of FIG. 1, a relatively high current, which as a rule is greater than, say, 150 to 200 amperes, flows through the planar coil 13. The heat which is produced thereby is carried away by the coolant flowing through the planar coil. The electrical current results in the formation of a magnetic field in planar coil 13, and the thinner the individual windings of the planar coil are and the more closely they lie together, the more uniform the magnetic field will be. The magnetic field passes through the insulating plate 18, the cathode 19a and the target 19 and assists the atomization of the target. On account of the arrangement selected, not only is the thickness of the coating deposited on the substrate 21 extremely uniform, but so is the atomization rate over the entire surface of the target 19, which consequently can be atomized down to an extremely small remnant of about 10 to 20%. It is entirely unnecessary to provide for relative movements between the individual parts.

In the subject of FIG. 3, the continuous plate of insulation material 18 of FIG. 2 is eliminated. Instead, each turn of the planar coil 13 is provided with an envelope of insulation material 22, which can consist advantageously of a ceramic material such as aluminum oxide ceramic. The target 19 in this case lies on the top generatrices of the insulation material envelope 22 which are also situated in a single plane. Between the target 19 and the planar coil 13 or the insulating envelope 22 it is aso desirable to provide a cooled cathode 19a in accordance with FIG. 2.

In FIG. 4, the planar coil 13 is embedded in a continuous body of insulation material 23, which consists, for example, of aluminum oxide ceramic. The target 19 lies on the body of insulating material 23.

In FIG. 5 a variety of embodiments of conductors are represented which can be used in making the planar coil 13. FIG. 5a represents a hollow conductor which is constructed in the form of a circular tube through which a coolant can circulate. FIG. 5c shows a similar embodiment of a tube of rectangular cross section. FIG. 5b shows a conductor having a solid circular cross section, and FIG. 5d shows a conductor of solid rectangular cross section. Conductors in accordance with FIGS. 5b and 5d are used to good advantage in conjunction with an apparatus in accordance with FIG. 7.

Figure 6:
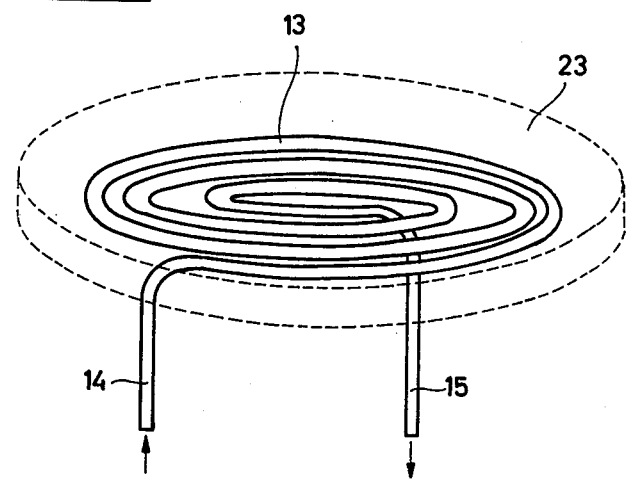
FIG. 6 is a perspective view of the subject of FIG. 4.

FIG. 6 shows a planar coil 13 constructed in the configuration of an Archimedean spiral, the ends 14 and 15 of which are bent downwardly. The coil is likewise embedded in a body of insulating material 23 which is in the form of a circular disk.

Figure 7:
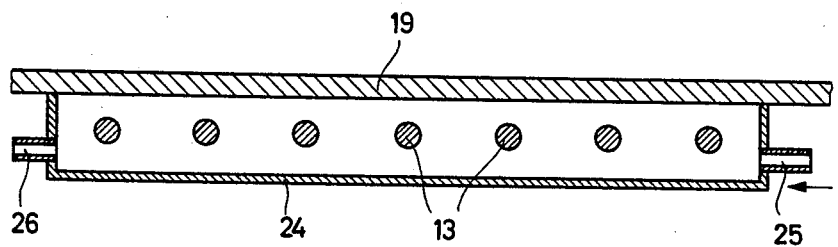
FIG. 7 is a cross-sectional view taken through a planar coil of solid material disposed within a cooling box whose one side is defined by a plate made of the target material.

FIG. 7 shows a box 24 which is provided with coolant connections 25 and 26. The box 24 is of a shallow cylindrical shape and contains a planar coil 13 which is also in the form of an Archimedean spiral. The upper wall of the box 24 is sealed off hermetically by the target 19. The operation of the planar coil 13 is the same as that of the planar coils in the other figures.

Figure 8A:
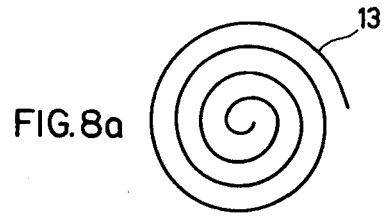
FIGS. 8a and 8b are diagrammatic top plan views of two planar coil configurations.
Figure 8B:
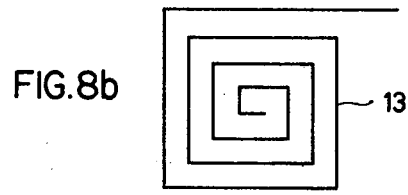

A number of embodiments of the planar coil 13 will be further explained in conjunction with FIG. 8. FIG. 8a shows an Archimedean spiral such as the one used in the subject of FIG. 6. The coil configuration shown in FIG. 8a is desirable whenever the cross section of the substrate or the disposition of the substrates is substantially circular. If rectangular substrates or rectangular arrangements of substrates are to be coated, the planar coil configuration shown in FIG. 8b is recommended. FIG. 8b represents a planar coil wound with right-angle bends in the manner of an Archimedean spiral. The pattern of the magnetic field can be widely varied by changing the shape of the planar coil and the distance between the individual turns of the conductor of which it is composed. By varying the current it is possible to vary the atomization rate continuously within wide limits.

If a dielectric material, that is, an insulator, is to be used as the target, it is possible to dispense with the plate of insulating material 18 in FIGS. 1 and 2 and the insulating envelope 22 in FIG. 3, or the embedding in an insulating body 23 as in FIGS. 4 and 6, i.e., the requirement that the planar coil be insulated from the target is fulfilled in these cases.

What is claimed is:

1. In a cathodic system having a planar target for use in an atomizing apparatus for the sputtering of a dielectric or nonmagnetic coating onto a circular substrate, the cathodic system including a magnetic field generator disposed on the side of the target opposite from that of the substrate, the improvement wherein the magnetic field generator comprises a single Archimedean circular spiral pancake coil electrically connected at both ends thereof to a source of current and disposed parallel to the target and having an area which corresponds substantially to the area of the target for developing a magnetic field wherein field lines are produced which are parallel to the planar surface of the target, means insulating the coil from the target and cooling means for cooling the coil.

2. Cathodic system according to claim 1, wherein the insulating means comprises an insulating plate on which the target is disposed and which lies upon the coil.

3. Cathodic system according to claim 1, wherein the insulating means comprises an envelope of insulating materials around the turns of the coil.

4. Cathodic system according to claim 1, wherein the insulating means comprises a continuous body of insulating material in which the coil is embedded.

5. Cathodic system according to claim 1, wherein the cooling means comprises a housing having coolant connections and in which the coil is disposed and wherein the wall of the housing facing the substrate comprises the target.

6. Cathodic system according to claim 5, wherein the coil comprises a solid elongated member having one of a rectangular or circular cross-section.

7. Cathodic system according to claim 1, wherein the coil comprises a hollow tubular member having one of a rectangular or circular cross-section and wherein the cooling means comprises means for circulating coolant through the hollow tubular member.

8. In a cathodic system having a planar target for use in an atomizing apparatus for the sputtering of a dielectric or nonmagnetic coating onto a rectangular substrate, the cathodic system including a magnetic field generator disposed on the side of the target opposite from that of the substrate, the improvement wherein the magnetic field generator comprises a single Archimedean rectangular spiral pancake coil electrically connected at both ends thereof to a source of current and disposed parallel to the target and having an area which corresponds substantially to the area of the target for developing a magnetic field wherein field lines are produced which are parallel to the planar surface of the target, means insulating the coil from the target and cooling means for cooling the coil.

9. Cathodic system according to claim 8, wherein the insulating means comprises an insulating plate on which the target is disposed and which lies upon the coil.

10. Cathodic system according to claim 8, wherein the insulating means comprises an envelope of insulating materials around the turns of the coil.

11. Cathodic system according to claim 8, wherein the insulating means comprises a continuous body of insulating material in which the coil is embedded.

12. Cathodic system according to claim 8, wherein the cooling means comprises a housing having coolant connections and in which the coil is disposed and wherein the wall of the housing facing the substrate comprises the target.

13. Cathodic system according to claim 12, wherein the coil comprises a solid elongated member having one of a rectangular or circular cross-section.

14. Cathodic system according to claim 8, wherein the coil comprises a hollow tubular member having one of a rectangular or circular cross-section and wherein the cooling means comprises means for circulating coolant through the hollow tubular member.

* * * * *